(12) United States Patent
Brukilacchio et al.

(10) Patent No.: US 6,856,436 B2
(45) Date of Patent: Feb. 15, 2005

(54) SCANNING LIGHT SOURCE SYSTEM

(75) Inventors: Thomas J. Brukilacchio, Reading, MA (US); John R. Householder, Reading, MA (US); Patrick W. Hopkins, Amherst, NH (US)

(73) Assignee: Innovations In Optics, Inc., Woburn, MA (US)

(*) Notice: Subject to any disclaimer, the term of this patent is extended or adjusted under 35 U.S.C. 154(b) by 77 days.

(21) Appl. No.: 10/601,605

(22) Filed: Jun. 23, 2003

(65) Prior Publication Data
US 2004/0001239 A1 Jan. 1, 2004

Related U.S. Application Data
(60) Provisional application No. 60/391,841, filed on Jun. 26, 2002.

(51) Int. Cl.[7] ............................................. G02B 26/08
(52) U.S. Cl. ..................... 359/196; 362/241; 362/800
(58) Field of Search ........................... 359/196–226, 359/851, 853, 900; 362/241, 245, 253, 341, 347, 348, 349, 350, 800; 358/475

(56) References Cited

U.S. PATENT DOCUMENTS

| | | | |
|---|---|---|---|
| 4,964,025 A | 10/1990 | Smith | |
| 5,289,356 A | 2/1994 | Winston | |
| 5,335,152 A | 8/1994 | Winston | |
| 5,343,029 A | 8/1994 | Katoh et al. | |
| 5,463,497 A | 10/1995 | Muraki et al. | |
| 5,586,013 A | 12/1996 | Winston et al. | |
| 5,699,201 A | 12/1997 | Lee | |
| 5,816,693 A | 10/1998 | Winston et al. | |
| 5,899,557 A | 5/1999 | McDermott | |
| 5,969,843 A | 10/1999 | Naiki et al. | |
| 6,149,283 A | 11/2000 | Conway et al. | |
| 6,200,002 B1 | 3/2001 | Marshall et al. | |
| 6,257,737 B1 | 7/2001 | Marshall et al. | |
| 6,577,429 B1 | 6/2003 | Kurtz et al. | |

OTHER PUBLICATIONS

Welford, W.T. and Winston, R., High Collection Nonimaging Optics, Academic Press, Inc., San Diego, 1989, pp. 213–215.

*Primary Examiner*—James Phan
(74) *Attorney, Agent, or Firm*—Francis J. Caufield

(57) ABSTRACT

A scanning light source system combines the outputs from multiple, spatially separated, sequentially pulsed light sources for travel in rapid succession along one or more common delivery paths to provide one or more collective outputs that are comparatively higher than would otherwise be possible with the light sources operating singly.

46 Claims, 18 Drawing Sheets

Table 1

Lens Design Scaled to a 100-mm focal length

| Lens # | Surface | Radius | Thickness | $n_d$ | Power | Abbe # |
|---|---|---|---|---|---|---|
| | 0 | Infinity | 56058.1810 | | | |
| | STOP | Infinity | -56058.1810 | | | |
| | CPC | Infinity | 207.4082 | | | |
| 64 | 3 | 459.5432 | 317.9224 | 1.491668 | 0.002997 | 55.310192 |
| | 4 | -643.4468 | 56.0582 | | | |
| | 5 | Infinity | 0.0000 | | | |
| 34 | 6 | Infinity | 560.5818 | 1.491668 | -0.000076 | 55.310192 |
| | 7 | -8471.2868 | 934.9330 | | | |
| 36 | 8 | 8089.6521 | 594.4619 | 1.491668 | 0.000266 | 55.310192 |
| | 9 | -2364.7682 | 1681.7454 | | | |
| 38 | 10 | 1719.8082 | 448.4655 | 1.491668 | 0.000281 | 55.310192 |
| | 11 | 60668.2952 | 1401.4545 | | | |
| | 12 | Infinity | 0.0000 | | | |
| 42 | 13 | Infinity | 0.0000 | | | |
| | 14 | Infinity | -840.8727 | | | |
| | 15 | Infinity | 840.8727 | | | |
| | 16 | Infinity | -840.8727 | | | |
| 44 | 17 | -2076.5417 | -420.0538 | 1.491668 | 0.000117 | 55.310192 |
| | 18 | -3064.8210 | -2356.2217 | | | |
| 46 | 19 | -848.0278 | -393.7192 | 1.491668 | 0.000705 | 55.310192 |
| | 20 | 3530.2928 | -700.4851 | | | |
| 48 | 21 | -236.4067 | -447.0583 | 1.491668 | 0.007155 | 55.310192 |
| | FIBER | 36.6046 | -34.5267 | | | |
| | 23 | Infinity | -56058.1810 | | | |
| | 24 | Infinity | 56058.1810 | | | |
| | 25 | Infinity | 0.0000 | | | |

Fig. 8d

SCANNING LIGHT SOURCE SYSTEM

CROSS REFERENCE TO RELATED APPLICATION

This application claims the benefit of priority from U.S. Provisional Patent Application No. 60/391,841 filed on Jun. 26, 2002 in the name of Thomas J. Brukilacchio, et al. with the title SCANNING LIGHT SOURCE SYSTEM, the entire contents of which are incorporated herein by reference.

BACKGROUND OF THE INVENTION

The present invention generally relates to high brightness light sources and more particularly to apparatus by which the outputs of multiple light sources can be beneficially coupled into a single output whose brightness is greater than that of the individual sources from which it is derived.

There are many uses for high brightness concentrated sources of light. Most of these applications require the use of a laser source, which are, to date, expensive and relatively complex. Therefore, laser sources are not applied to many problems needing a high brightness concentrated light source because they are too expensive and complex.

Light emitting diodes (LEDs) represent another possible source for achieving high brightness. However, a single LED or single array of LEDs operated continuously (CW) is limited in the brightness that can be obtained when imaged into a spot focus with a given numerical aperture as, for example, that of an optical fiber. In addition, the optical power out of an LED is limited because of the build up of high levels of damaging heat when operated CW near peak power levels. Nevertheless, LEDs represent an attractive alternative to lasers since they are less complex and expensive, are available over a range of colors ranging from the ultraviolet through the mid infrared spectrum, and can be modulated at decreased duty cycles to provide increased peak power without experiencing heat damage. Other sources of optical radiation that can be modulated to provide increased peak power by operation at decreased duty cycles include laser diodes, xenon flash lamps, and the like.

Hence, it is a primary object of the present invention to provide a low cost, high brightness concentrated source of light.

It is another object of this invention to provide a low cost, high brightness source that uses a multiplicity of relatively lower cost sources whose outputs are serially coupled as a single output whose brightness is higher than would otherwise be available from a single source.

It is another object of the invention to provide a low cost, high brightness source by serially coupling the outputs of a multiplicity of LEDs to provide a single source that is brighter than the brightness that otherwise could be made available from a single LED.

It is another object of the invention to provide a low cost, high brightness source by serially coupling the outputs of a multiplicity of LEDs of different color to provide a single source that is brighter and of different color than would otherwise be available from a single LED.

It is still another object of the present invention to provide a variety of different apparatus for serially coupling the outputs from a multiplicity of LEDs to provide a low cost, high brightness source.

Another object of this invention is to provide relatively compact and lightweight apparatus for serially coupling the outputs from a multiplicity of LEDs to provide a low cost, high brightness source.

Other objects of the invention will, in part, be obvious and will, in part, appear hereinafter when the following description is read in connection with the drawings.

SUMMARY OF THE INVENTION

The present invention relates to apparatus and methods for serially coupling multiple light sources into a single output. The multiple light sources are pulsed at a rate that allows them to output light at a much higher level than they otherwise could. By rapidly combining these higher output pulsed sources, a comparatively large amount of light can be coupled to a single output to provide a concentrated source of high brightness.

Generally, the invention comprises a high brightness illumination system, comprising a plurality of modulatable light sources that are spatially separated in a prearranged pattern. Drive means are provided for exciting the light sources in a predetermined sequence to provide a plurality of light pulses that are separated in space and time. Scanning means serially receive and redirect the outputs of the plurality of light pulses for travel in rapid succession along one or more collection paths to provide a collective output that is comparatively higher in brightness than would otherwise be possible with the light sources operating individually.

The light sources can comprise LEDs, laser diodes (LDs), or xenon flash tubes, although LEDs are preferred. In one aspect, arrays of LEDs are used in conjunction with arrays of compound parabolic concentrators and collimator optics to provide sequential collimated beams that are subsequently directed into the output of a downstream collector in the form of an optical fiber cable. Scanning preferably is done by focusing lenses that form an image of the collimated beams on a scanning element after which it is reimaged onto the entrance pupil of the collecting fiber such that the product of a sources emission solid angle and its emitting area is substantially equal to the collection area and solid angle of acceptance of the fiber cable to assure optimal coupling.

In variant alternative embodiments, acousto-optical modulators (AOMs) and diffractive arrangements can be configured to provide the scanning function and color mixing with diffractive elements is shown. Phosphor layers may be used to provide desired colors.

A method provides a high brightness source of illumination by steps comprising mounting a plurality of modulatable light sources so that they are spatially separated in a prearranged pattern and then exciting the light sources in a predetermined sequence to provide a plurality of light pulses that are separated in space and time and higher in intensity than would otherwise be produced by the sources operating continuously. The outputs of the light sources are scanned to serially receive and redirect them for travel in rapid succession along one or more collection paths to provide a collective output that is comparatively higher in brightness than would otherwise be possible with the light sources operating individually.

BRIEF DESCRIPTION OF THE DRAWINGS

The structure, operation, and methodology of the invention, together with other objects and advantages thereof, may best be understood by reading the detailed description in connection with the drawings in which each part has an assigned a descriptive label or numeral that identifies it wherever it appears in the various drawings and wherein:

FIG. 8d is a table presenting lens prescription data for a design for practicing the invention;

DETAILED DESCRIPTION

The present invention provides a variety of embodiments for simple, low-cost, high brightness concentrated sources of light that may be used in place of lasers in a range of applications.

Examples of white light applications for the present invention include, but are not limited to, LCD projection systems (Metal Halide or High Pressure Mercury arc lamp replacement), surgical headlights, endoscope illumination, video system illumination, major surgical auxiliary lighting, high brightness industrial illumination, remote light delivery, automotive interior light engine, and/or architectural lighting, etc.

Examples of single color applications for the present invention include, but are not limited to, photodynamic therapy (PDT), adhesive curing systems, and/or medical or dental curing, etc.

The present invention applies to any source of optical radiation that can be modulated to provide increased peak power with decreased duty cycle including, but not limited to, LED's, laser diodes, xenon flash lamps, etc.

The use of Light Emitting Diodes (LED's), however, is a preferred source because LEDs are available in multiplicity of colors or wavebands ranging from the ultraviolet through the mid infrared spectrum and can be mixed to synthesize other colors.

Figure 1:
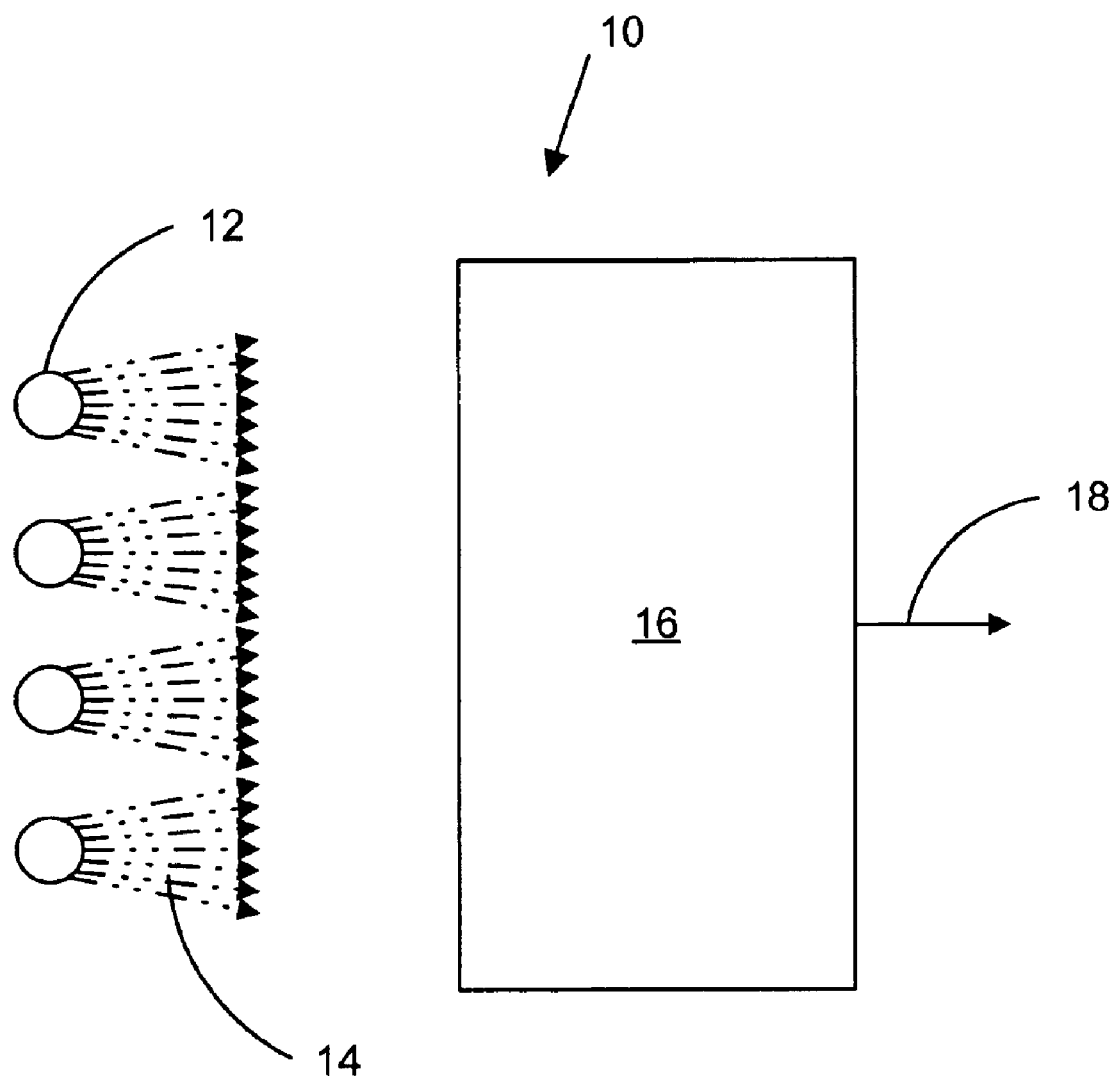
FIG. 1 is a diagrammatic high-level block diagram for the general architecture of a scanning light system of the invention.

A preferred embodiment of the present invention is illustrated in FIG. 1. As seen in FIG. 1, the invention is a lighting system 10 comprising two major components the light sources 12, comprised of a multiplicity of individual light sources and the scanning system or collection and directing system 16. The function of the individual light sources 12 is to provide a high power light for a relatively brief period of time. The purpose of the scanning system 16 is to optically couple the outputs from individual light sources into a single high brightness output, which is designated at 18.

Figure 2:
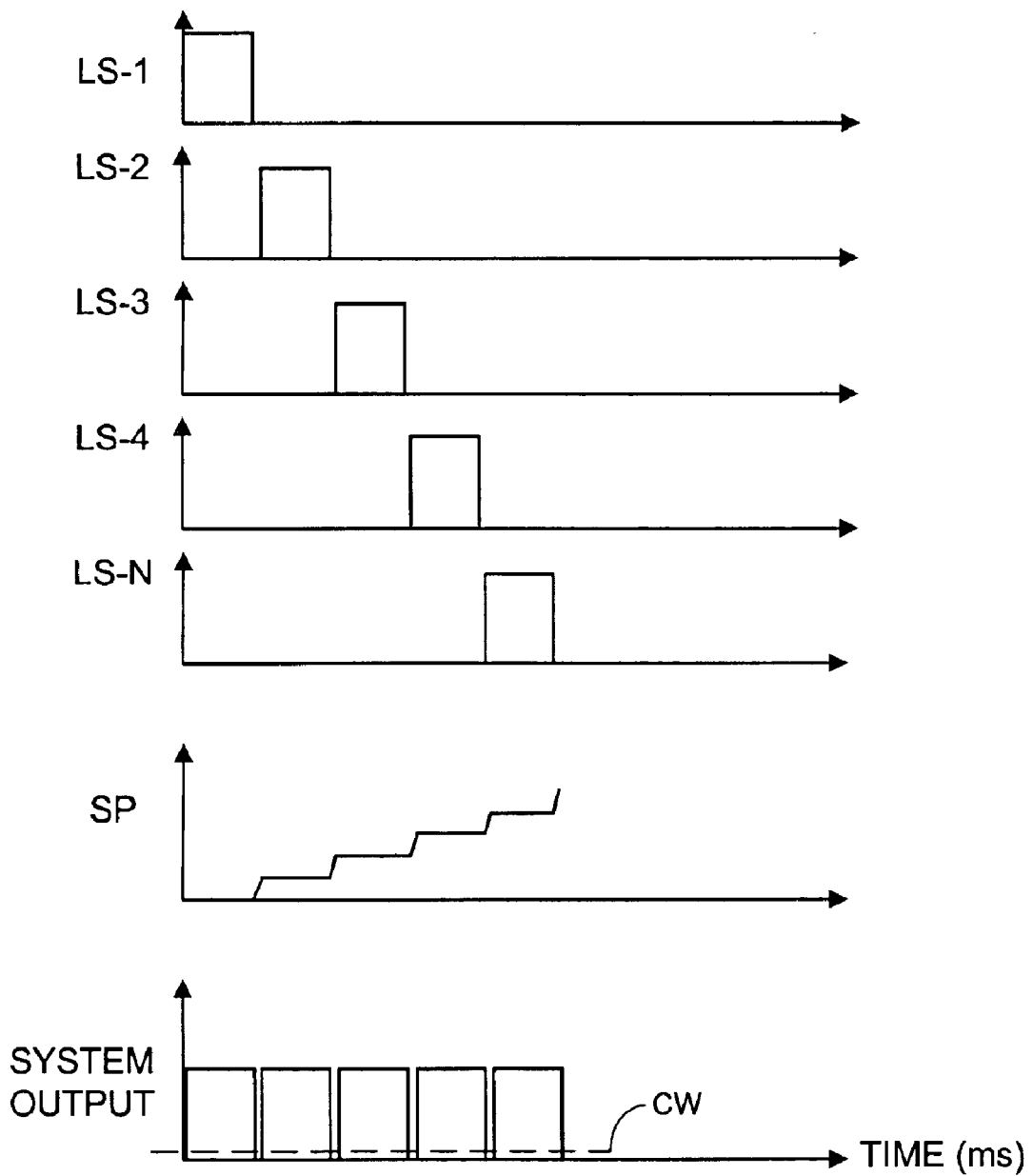
FIG. 2 is a diagrammatic system timing diagram of the invention showing the relative sequence of pulses for its individual light sources, the position of the scanner of the invention in relation to the light pulses provided by the individual light sources, and the coupled outputs of the individual light sources as they appear as a single source of high brightness.

FIG. 2 illustrates a system timing diagram of a preferred embodiment of the present invention. As shown, each light source 12 (labeled LS-1, LS-2, etc.) is turned on at a different time, stays on for a brief period of time, and then turns off. The scanner 16 (SP) operates in synchronization with the timing of the individual pulses to optically couple each in turn into output 18. Thus, the scanner serially operates with one pulse at a time to sequentially couple each pulse in turn into output 18. This process repeats in rapid succession, producing a nearly continuous output of the form shown at the bottom of FIG. 2 labeled "System Output". As seen in FIG. 2, the System Output is substantially higher than the CW output that can be provided by the individual sources. For visual applications, the pulse rate should be higher than the human visual system flicker rate and for other applications can be higher as needed.

Figure 3:
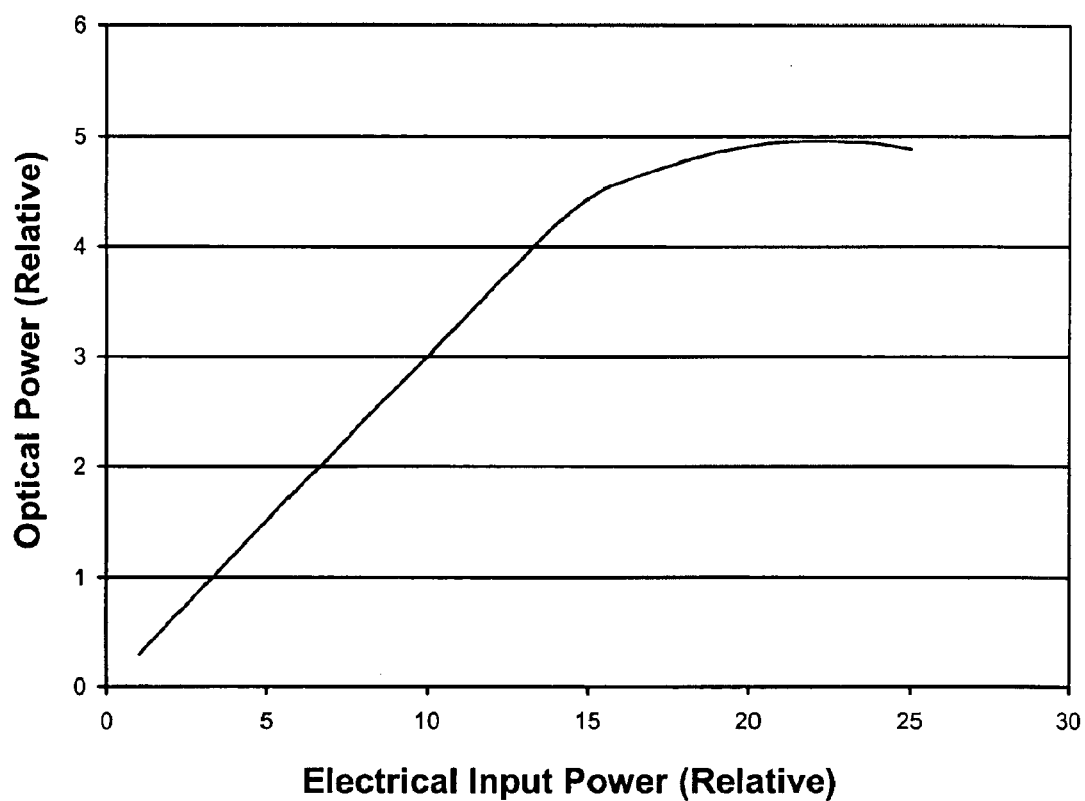
FIG. 3 is a graph of the continuous optical power output of an individual source used in the invention as a function of electrical input power.

The reason why the peak of the System Output is significantly higher that is otherwise possible operating the sources CW has to do with the operating properties of the individual sources. When light sources such as light emitting diodes (LEDs) or laser diodes are run with continuous power, they have a finite limit to the amount of light that can be extracted from them as illustrated in FIG. 3. As seen there, optical power increases with electrical input power until a limit is approached. When more electrical power is applied beyond this limit, no more, or even a decreasing amount of light is extracted. One of the prime mechanisms for the limit to optical power output is the build-up of heat within the device. When the same device is pulsed for a short period of time, then turned off for a period of time before being pulsed again, it can be operated at a much higher peak optical power while maintaining the same average electrical power and heat load.

Figure 4:
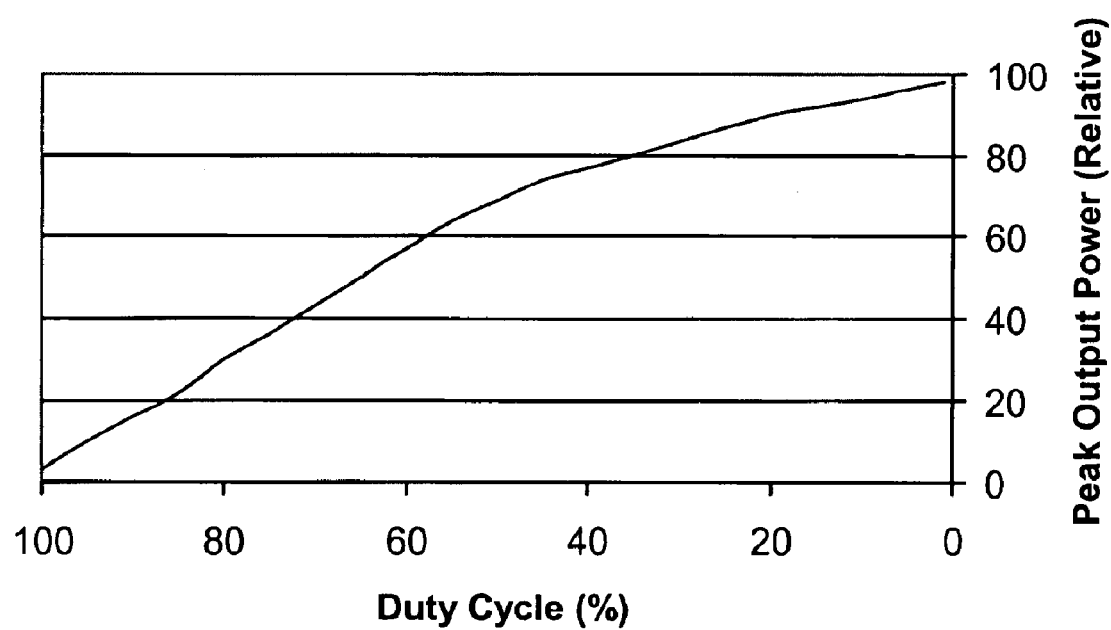
FIG. 4 is a graph illustrating peak optical power as a function of duty cycle for individual light sources used in the invention.

FIG. 4 illustrates the relationship between peak optical power and duty cycle (the ratio between device on time and on time plus off time). As the FIG. 4 shows, with lower duty cycle, higher peak optical power can be extracted from each individual device. Thus, the average power of the output signal shown in FIG. 2 is many times higher than the continuous output of a single light source. As FIG. 4 illustrates, peak relative power can change from approximately 2 to in excess of 90 for a change in duty cycle of 100 to 1, thus permitting the concentrated brightness of the output 18 to be significantly brighter than any of the individual source inputs.

Figure 5:
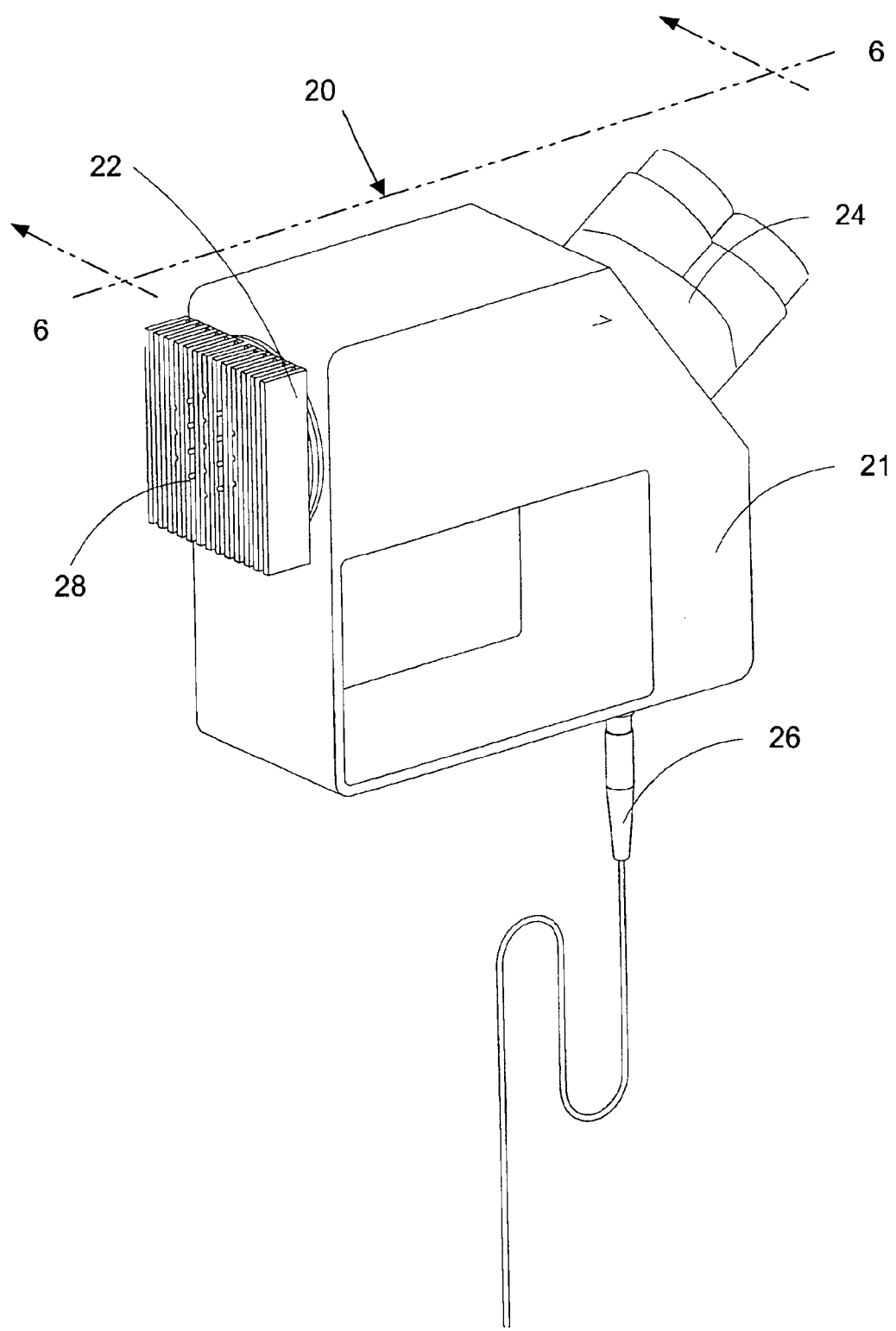
FIG. 5 is a diagrammatic perspective exterior view of a preferred embodiment of the invention.

FIG. 5 illustrates a preferred embodiment of the present invention where it is designated generally as a system 20 having a body 21 for its major components. System 20 includes an LED die or chip 28 as light sources and a voice-coil actuated 2-axis scanner 24. As shown in FIG. 5, a heat sink 22 is provided to cool the LED chip 28. An optical fiber cable 26 optically and mechanically couples to complementary configured structure on or in body 21 and serves as the output for the collective system light output 18. Light emerging from the distal end of optical fiber cable 26 is thus a highly bright and concentrated source that may be used for any sensible downstream application requiring its properties.

Figure 6:
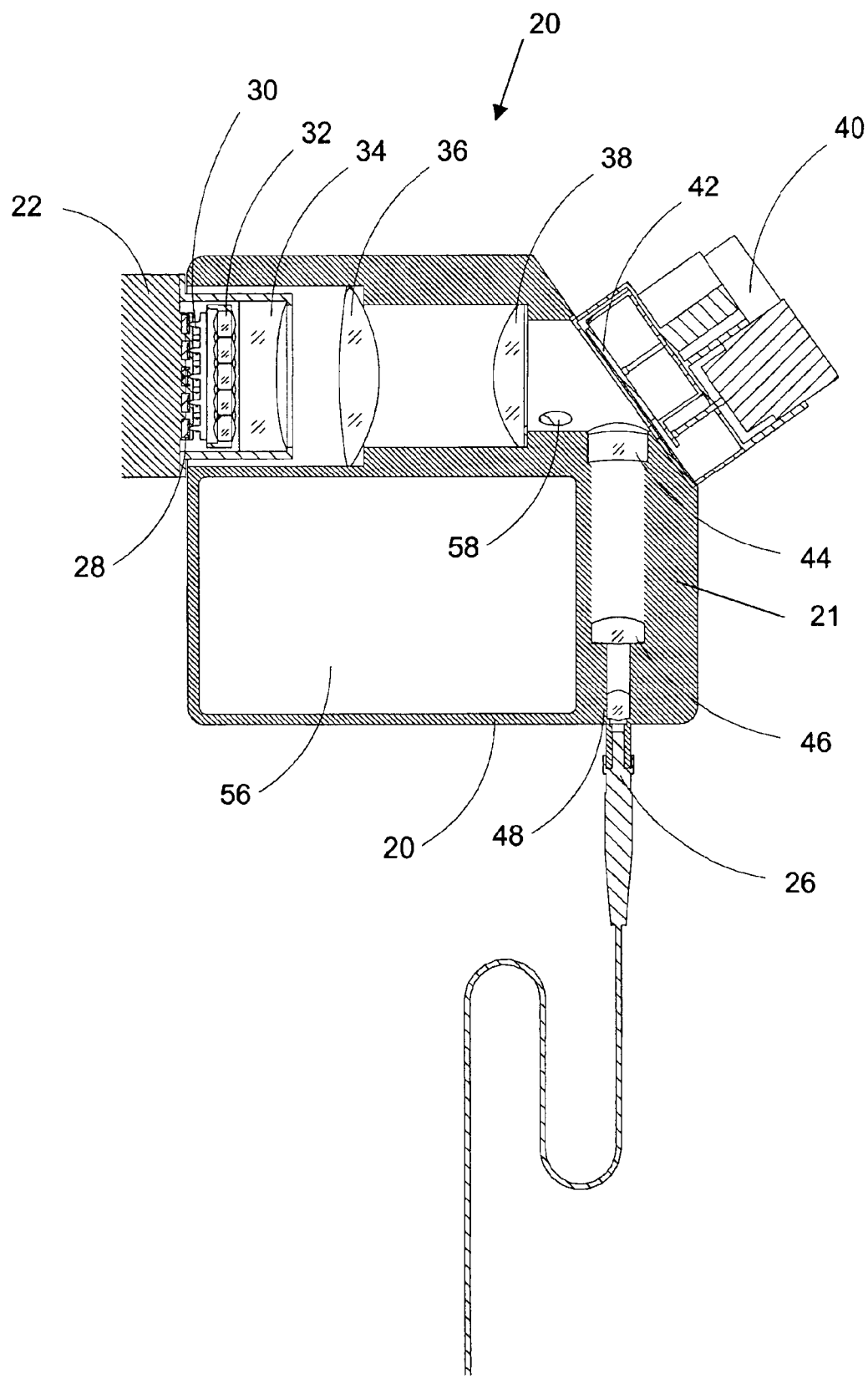
FIG. 6 is a cross-sectional elevational view of the embodiment of FIG. 5 taken generally along line 6—6 of FIG. 5.
Figure 7:
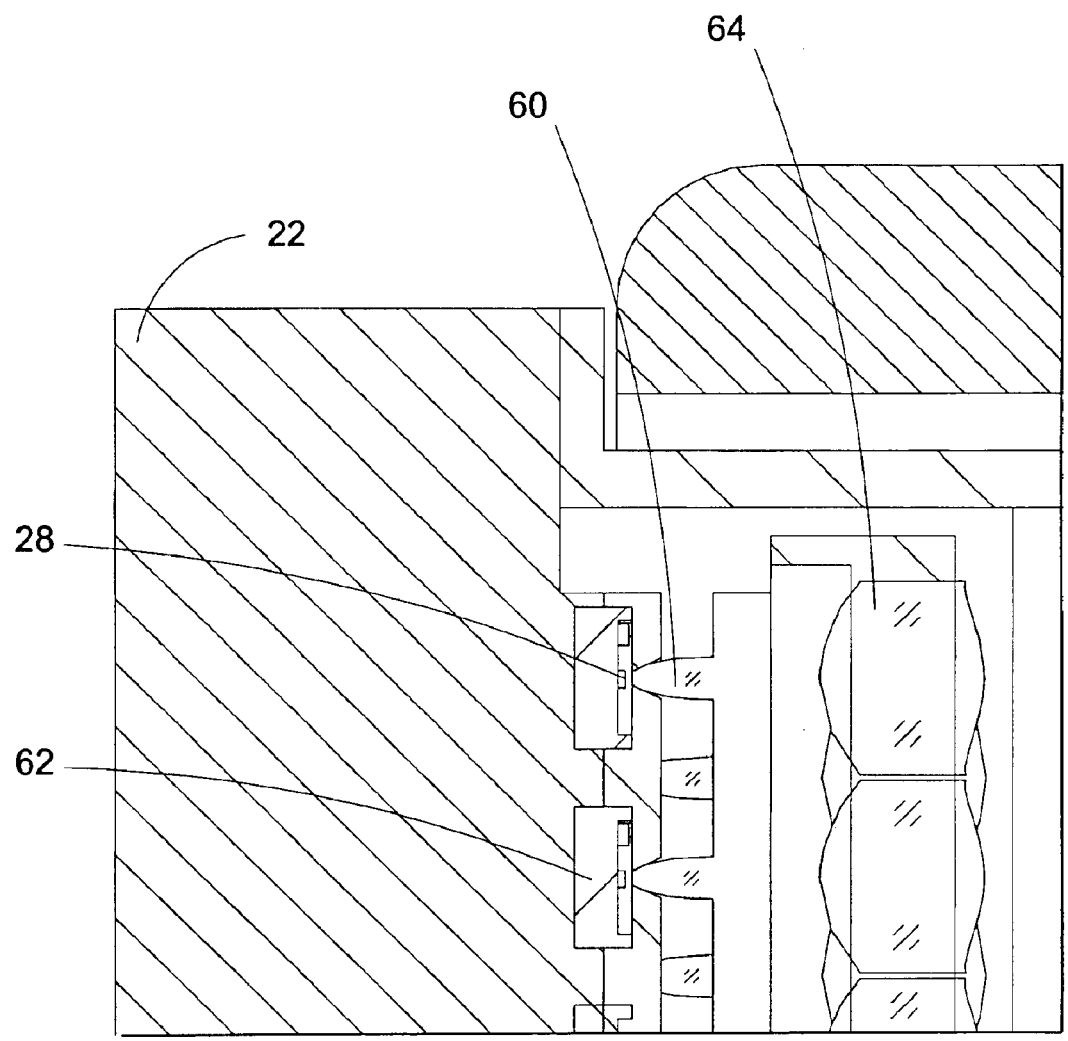
FIG. 7 is an enlarged cross-sectional elevational view of a portion of FIG. 6 showing in greater detail collection optics and LED sources used in practicing the invention.

FIG. 6 shows a cross-sectional view of the system 20 illustrated in FIG. 5, and FIG. 7 illustrates a more detailed view of heat sink 22 and LED die 28 illustrated in FIG. 5 and FIG. 6.

In the system 20 as illustrated in FIGS. 5, 6 and 7, the LEDs 28 are mounted on well-known headers that efficiently pass the heat to the heat sink 22. In an alternative embodiment, heat sink 22 can also use a fan, liquid cooled heat exchanger, or TE coolers to more effectively remove heat.

As best seen in FIGS. 6 and 7, the LEDs may take on the form of a one or two dimensional array composed of individual emitting areas each of which is coupled into a corresponding optical element of an array of optical elements 30. An array of collimating lenses 32 operates on the outputs from the optical element array 30 to provide a series of collimated beams when an individual LED is turned on. The collimated beams each pass through a focusing lens subsystem comprising a field lens 34 and two converging lenses 36 and 38 all of which are constructed to image each collimated beam onto a mirror 42 that is mounted for two-dimensional displacement and actuated by a voice coil 40 or the like so that it can be made to tip and tilt with respect to the optical axis.

The images formed on mirror 42 are, in turn, re-imaged into the core of the optical fiber cable 26 by a re-imaging lens subsystem comprising three elements 44, 46 and 48. A quadrant detector 58 is included to provide signals for controlling the position of mirror 42. Well-known system electronics are provided to control the various system functions and drive the LEDs and mirror 42 in concert with one another as required by the timing diagram of FIG. 2. System electronics are located in an electronics area 56 provided for this purpose.

Figure 8A:
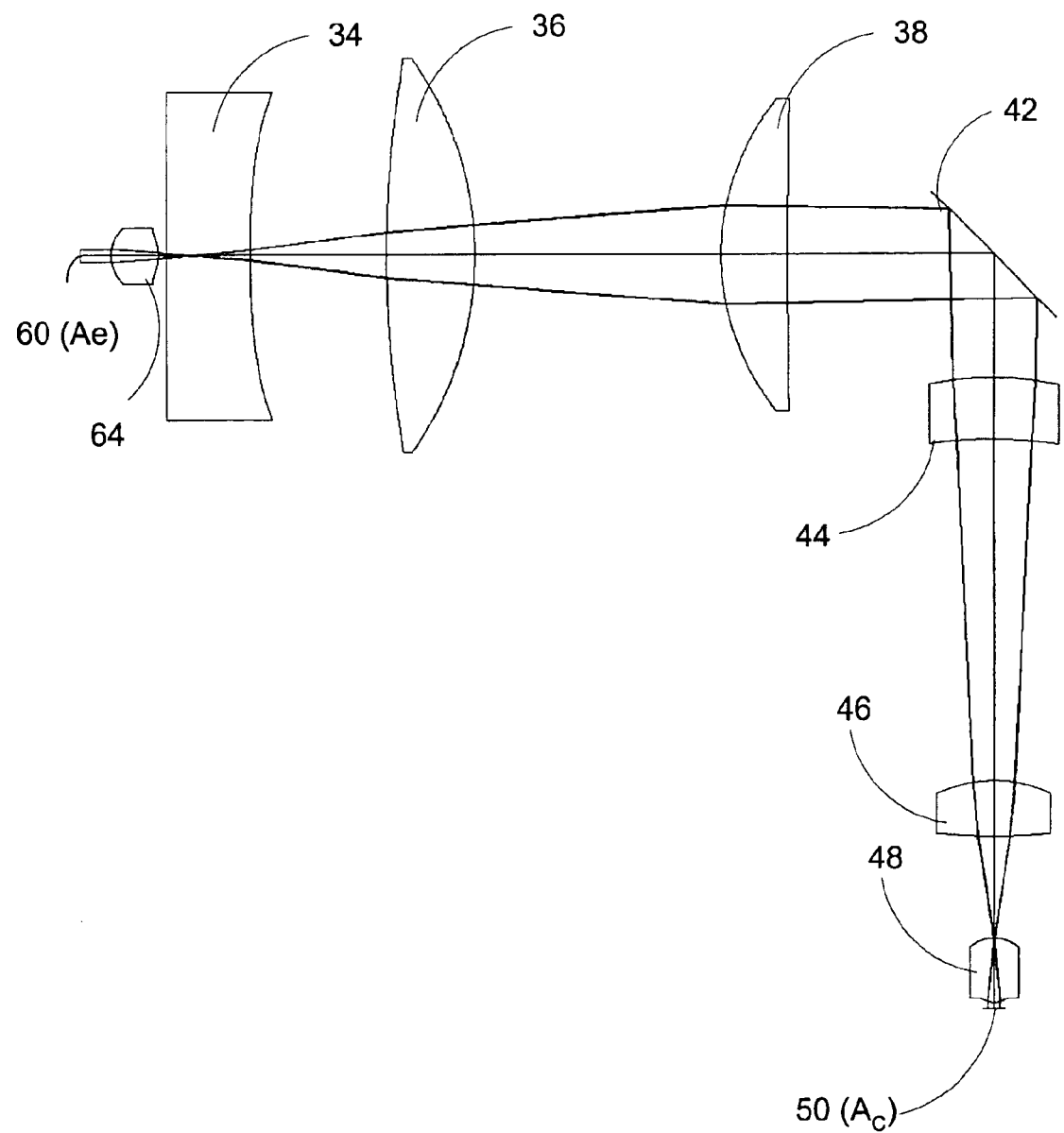
FIG. 8a is a diagrammatic elevational view of a portion of the optical system of the invention illustrating the path taken by certain rays emerging from an axially located LED as they course their way to the input of an optical fiber that serves as the at the output of the system.
Figure 8B:
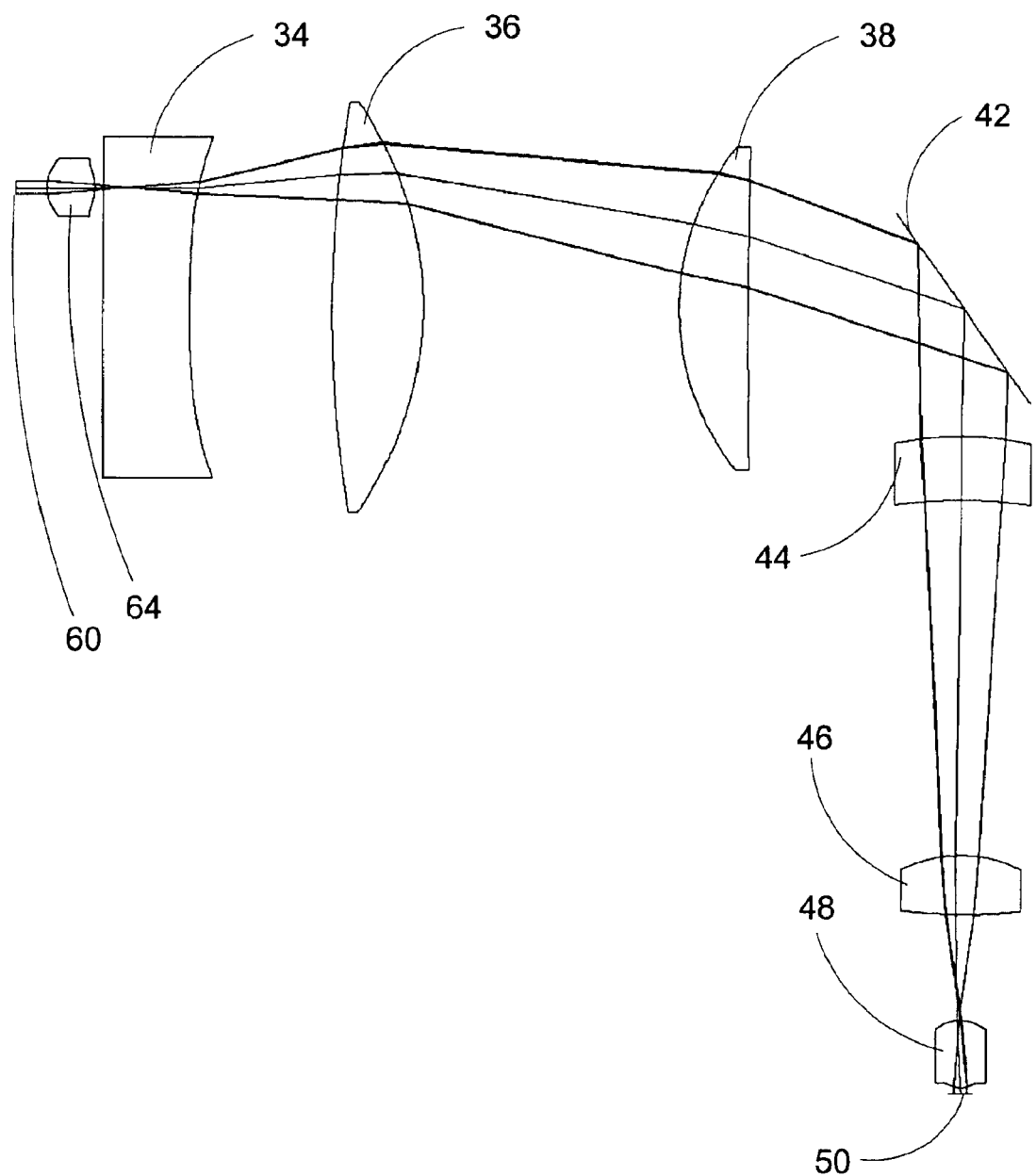
FIG. 8b is a diagrammatic elevational view of a portion of the optical system of the invention illustrating the path taken by certain rays emerging from an LED located at an off-axis position as they course their way to the input of an optical fiber that serves as the output of the system.
Figure 8C:
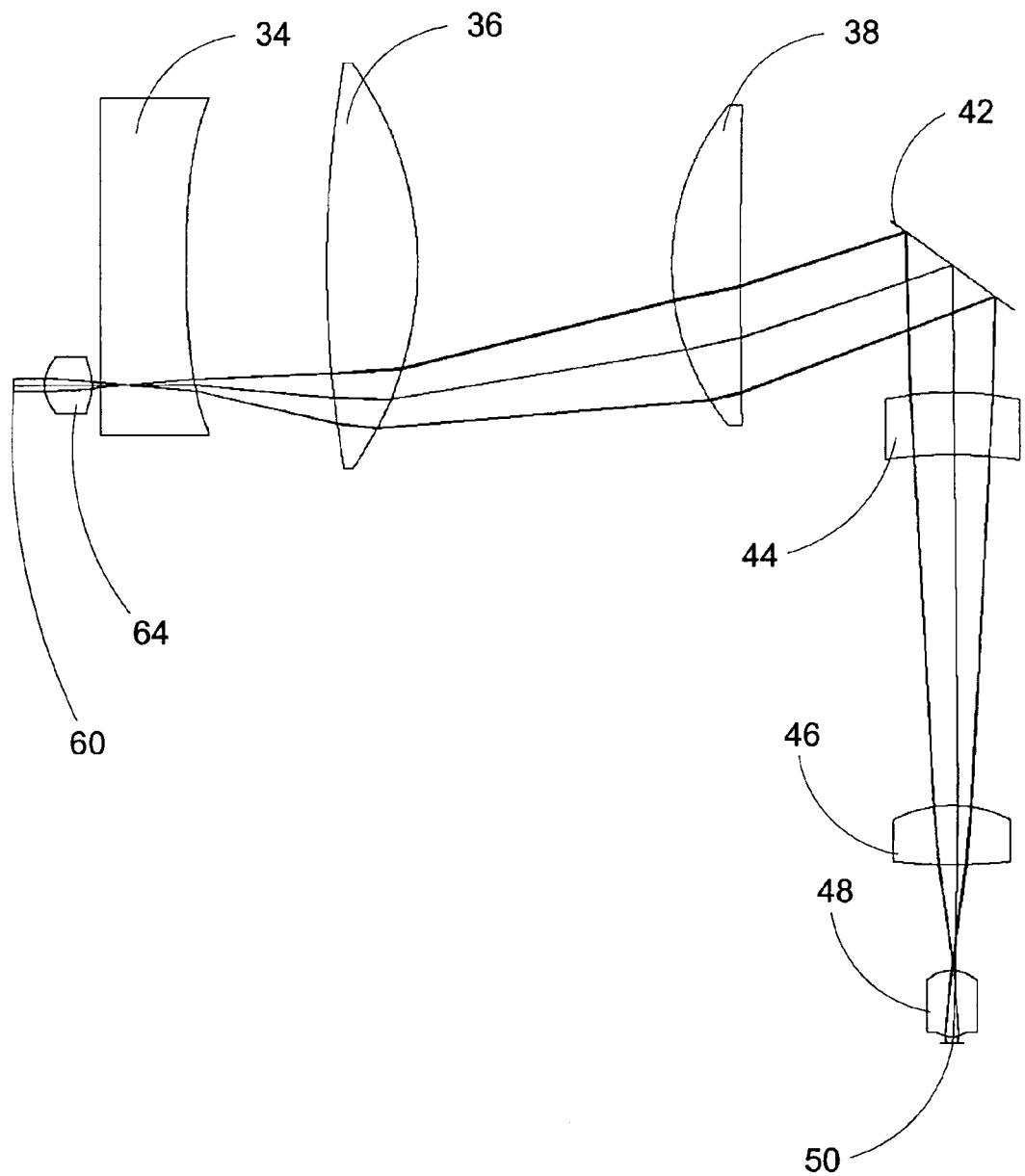
FIG. 8c is a diagrammatic elevational view of a portion of the optical system of the invention illustrating the path taken by certain rays emerging from an LED located at an off-axis position other than that shown in FIG. 8b as they course their way to the input of an optical fiber that serves as the output of the system.

As Illustrated in FIG. 7, the output of each LED in die 28 is efficiently out-coupled by a non-imaging concentrator such as, but not limited to, a compound parabolic concentrator (CPC) 60 integrally formed as an element of collection array 30. Each CPC, which is structured to operate by total internal reflection (TIR) or may be provided with reflective surfaces as needed with. e.g. UV light, effectively collects all of the light from its corresponding LED in chip 28 and emits substantially 100 percent of it through an exit pupil that is preferably 1.5 mm in diameter. The collimating lens array 32 is comprised of an array of collimating lens elements 64 (typical) that form individual collimated beams of the light emerging form the exit pupil of a corresponding CPC. Thus, each collimating lens 64, illustrated in FIG. 7 collects the light exiting points on the exit pupil of a corresponding optical concentrator and focuses it to infinity as is illustrated in FIGS. 8a, 8b, and 8c. which are ray traces corresponding to an on-axis LED emitting, an off-axis upper LED emitting, and an off-axis lower LED emitting.

To summarize, the focusing lenses illustrated in FIG. 6 form an image on the mirror in the 2-axis scanner 24. The scanner 24 acts to direct each of the images of the output face of the optical concentrators through the re-imaging lenses and into the core of output fiber, which is illustrated in FIG. 8.

In a preferred embodiment of the present invention, the re-imaging lens system is generally telecentric in image space to effectively couple into the numerical aperture of the optical fiber. In other words, the solid angle over which light emerges from a CPC, call it $\Omega_e$, times its emission area, $A_e$, is substantially equal to the solid angle of collection of the optical fiber core, call it $\Omega_c$, times its collection area $A_c$. Preferably $A_e = A_c$, i.e., $A_c = 1.5$ mm also, for one to one imaging. Alternatively, the re-imaging lenses may be replaced with a CPC.

In a preferred embodiment, the focal length of the optical system is 1.78 mm, the semi-field angle of the output of a CPC is 30 degrees and the NA of the optical fiber cable is 0.5 thus providing it with a semi-field acceptance angle of 30 also.

Constructional or prescription data for a preferred optical system is given in convention form Table 1 of FIG. 8d, where it has been scaled to a focal length of 100 mm. Those skilled in the art will appreciate that this constructional data may be rescaled keeping in mind that aberrations do not scale linearly.

Illustrated in FIG. 6, the quadrant detector 58 is positioned at an angle relative to the scanner mirror 42, but outside of the effective ray bundle (See FIGS. 8a–c). A collimated light source (not shown) is positioned at an equal, but opposite angle relative to the mirror 42. As the mirror 42 moves in space, the collimated light from the light source also moves and falls on the quadrant detector in a changed manner. The new position is interpreted by electronics to represent the position of mirror 42. This mirror position signal is then used by well-known scanner controller electronics to control the motion of the mirror 42. The control and LED drive electronics (not shown) as mentioned are contained in housing 21.

In an alternative embodiment of the present invention, the mirror control optics are incorporated into the scan mirror system by reflecting off the backside of the mirror 42.

Figure 9:
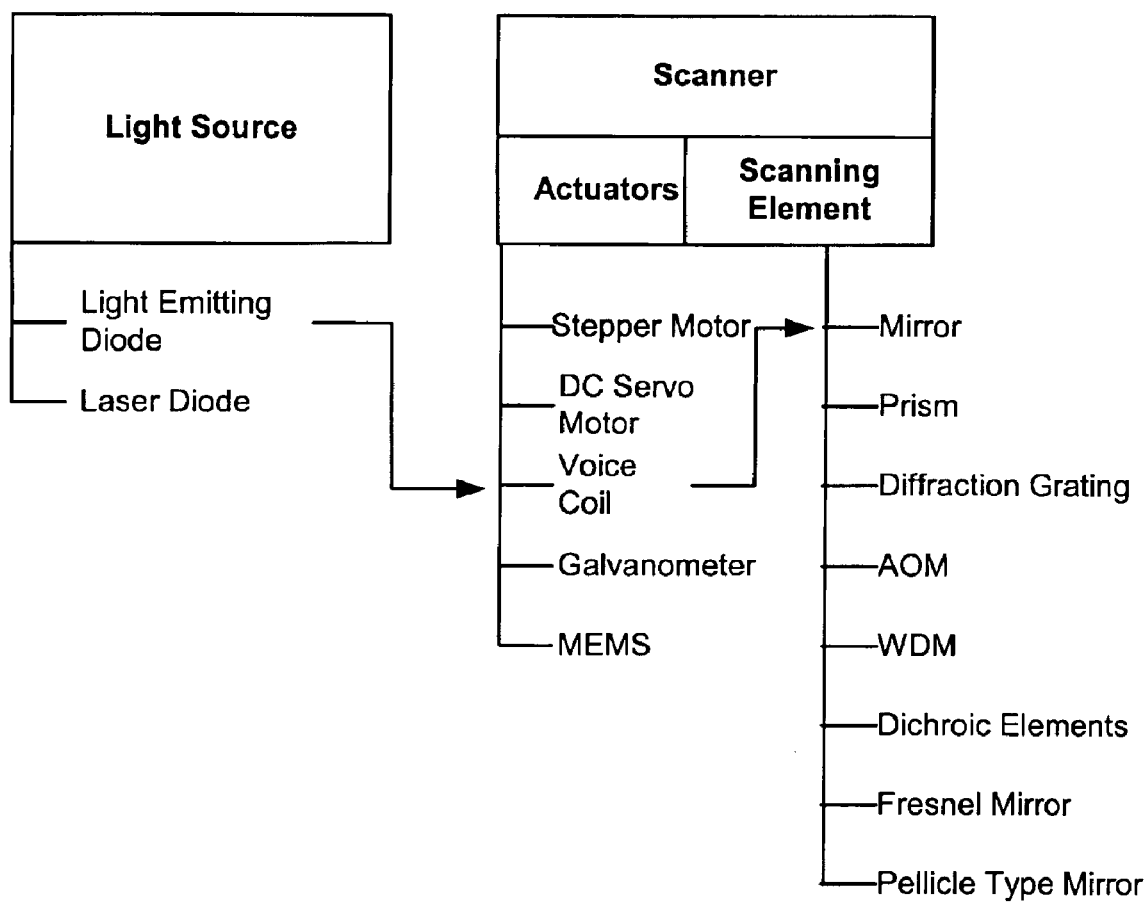
FIG. 9 is a tree diagram showing a variety of possibilities for practicing the invention by combining different light sources, actuators, and scanning elements.

As mentioned earlier, the present invention generally comprises a plurality of light sources 12 and a scanner 16. Within the scanner 16, there is an actuator and a scanning element. Examples of the light source include, but are not limited to light emitting diodes, laser diodes and/or xenon flash lamps, etc. Examples of the actuator include, but are not limited to, a stepping motor, a DC servomotor, a voice coil, a galvanometer, and/or a micro electromechanical device (MEMS), etc. Examples of the scanning element (and/or scanning system) include, but are not limited to, a mirror, a prism, diffraction grating, an acousto optical modulator, a wavelength division multiplexer, dichroic elements, a Fresnel mirror, and/or a Pellicle type mirror, etc. These examples are illustrated in FIG. 9 which also provides a tree arrangement illustrating various possibilities by which the foregoing elements may be beneficially combined to practice the invention.

Figure 10:
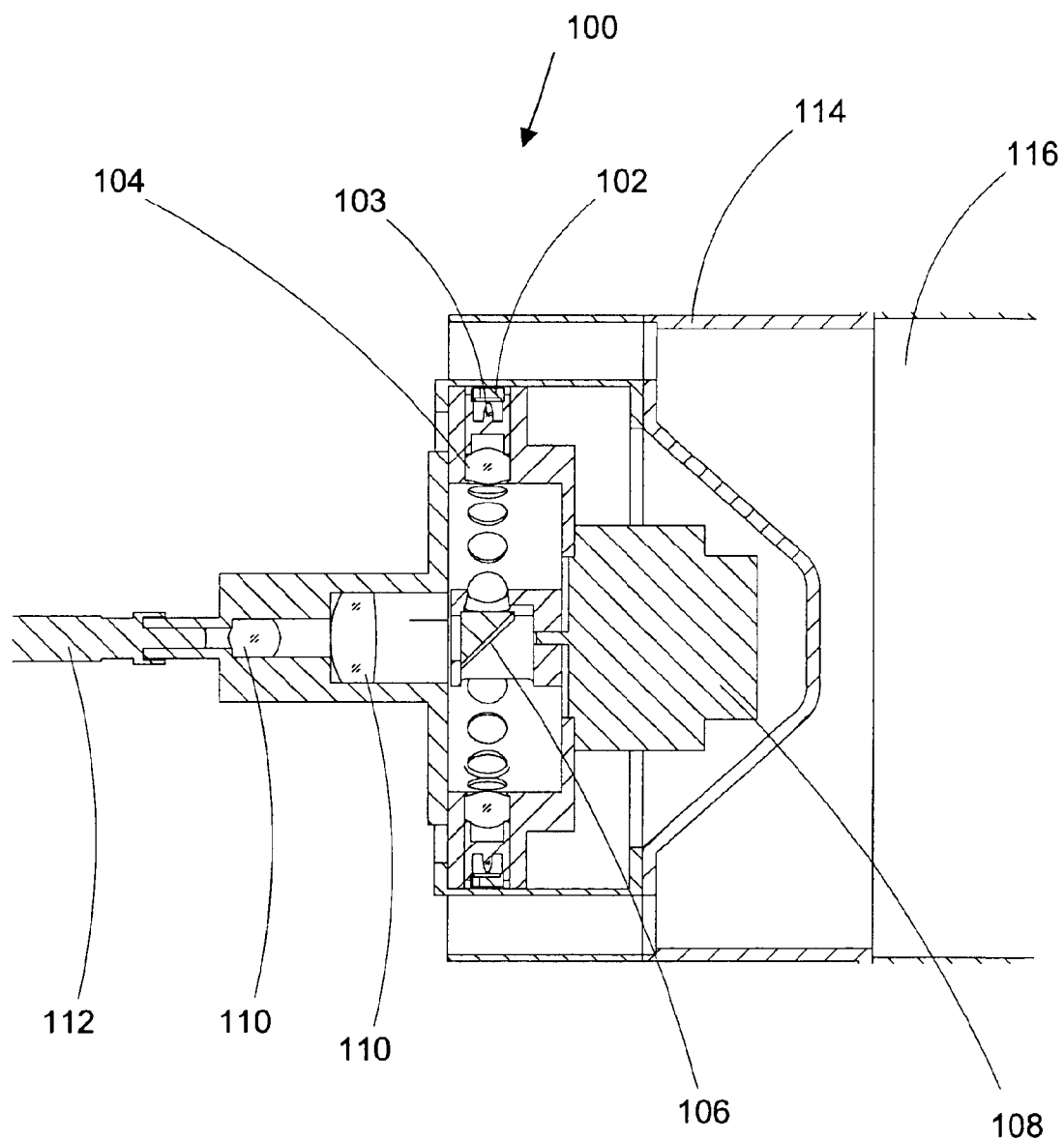
FIG. 10 is a diagrammatic elevational view of a rotary embodiment of the invention in which a prism and DC servo motor are employed to serially couple the outputs from radially located individual sources to provide a high brightness single source.

FIG. 10 illustrates a cross-sectional view of an alternative embodiment of the present invention where it is designated generally as a system 100. System 100 uses a single axis scanning actuator (DC servomotor with encoder) 108 and a prism 106 and holder therefor as a scanning element. The light sources are LED die 102 arranged radially around the center of rotation, facing radially inward or perpendicular to the system optical axis or path. Each LED 102 has a concentrating optical component 103 and a collimating lens 104 that directs collimated light to the prism 106, which reflects the light into focusing lenses 110. The focusing lenses 110 focus the light into the core of an output optical fiber 112.

Figure 11:
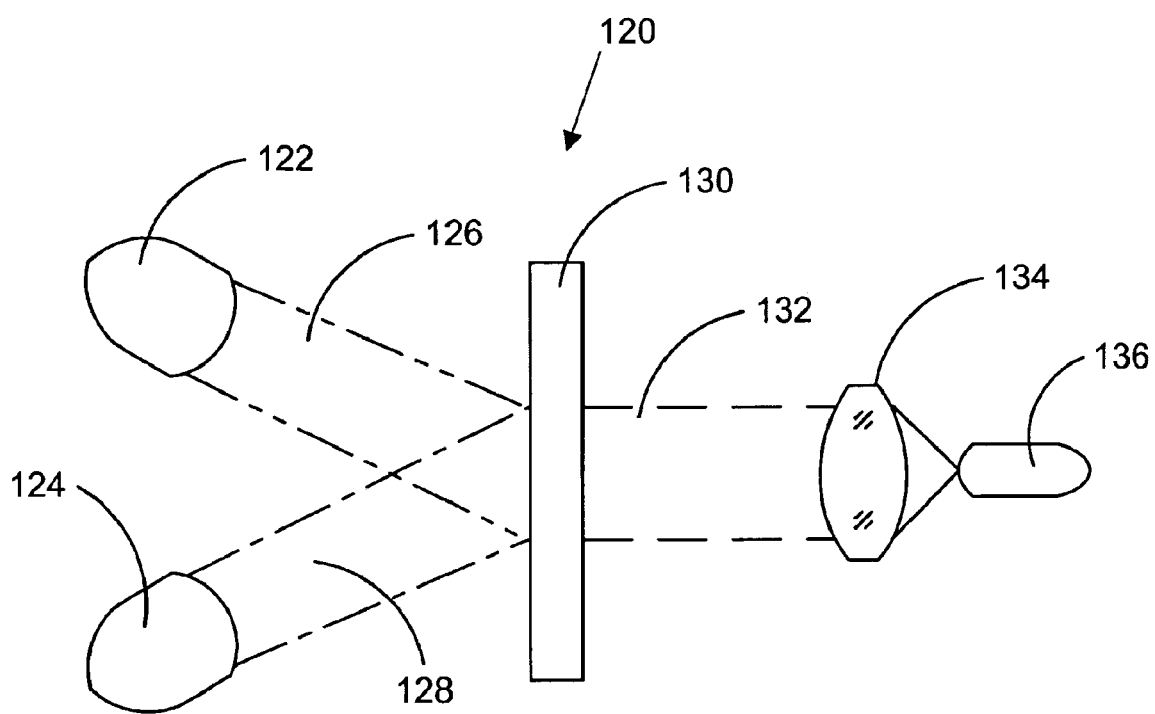
FIG. 11 is a diagrammatic elevational view of another embodiment of the invention in which an AOM is used to serially couple the outputs from off axis located individual sources to provide a high brightness single source.

FIG. 11 illustrates an alternative embodiment of the present invention designated here as a system 120. With system 120 multiple light sources 122 and 124, similar to those in the system shown in FIG. 10, are arranged so that collimated light beams 126 and 128, respectively, are directed into an acousto-optic modulator or AOM 130. AOM 130, which may be KDP or lithium niobate ($LiNbO_3$) is modulated in a well-known manner so that it directs the light from each light source into a focusing lens 134 and subsequently into an output element 136, which can be a fiber as before. It may be possible to arrange two AOM units at 90 degrees orientation and collect light from a 2-dimensional arrangement of light sources.

Figure 12:
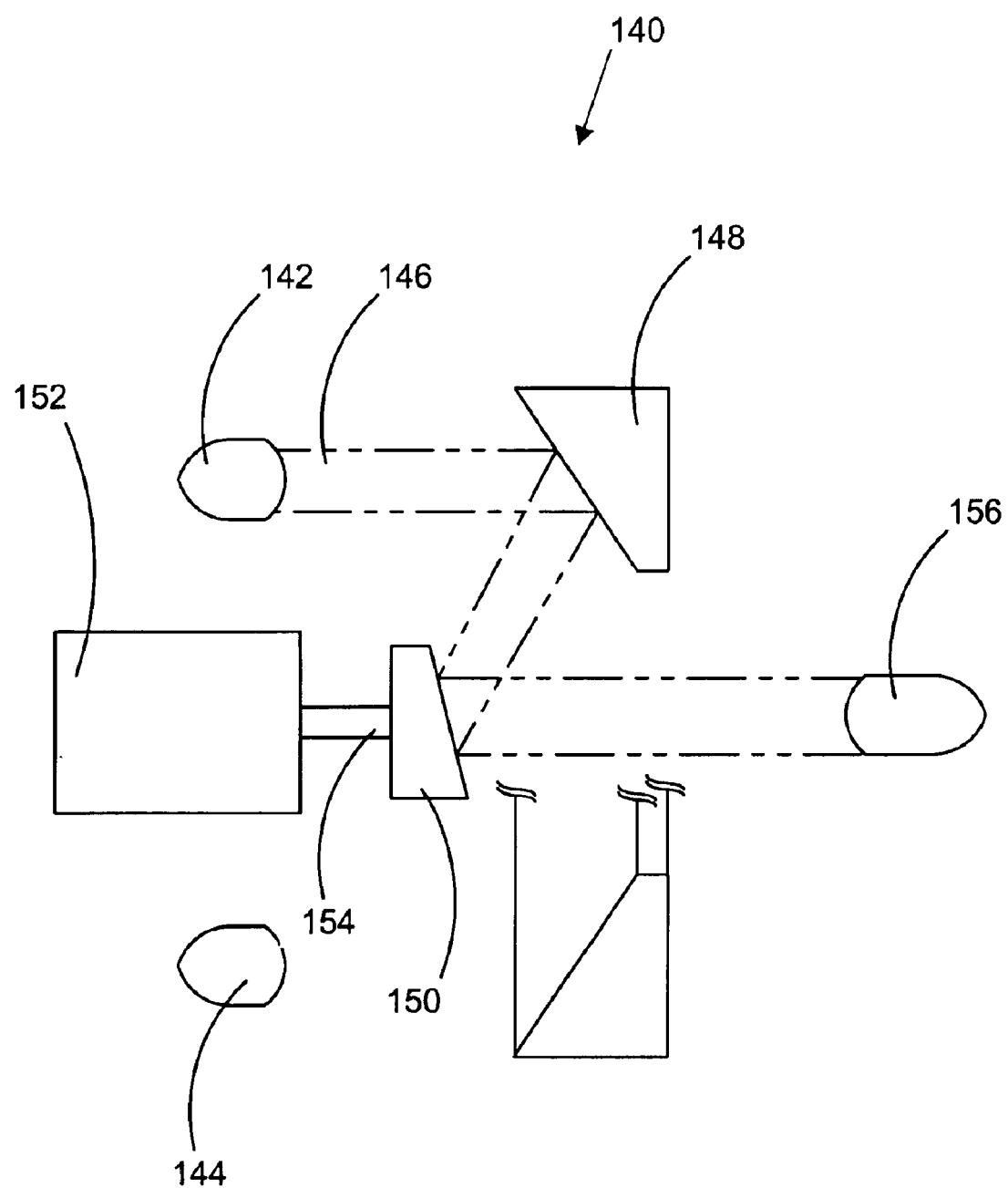
FIG. 12 is a diagrammatic elevational view of yet another embodiment of the invention in which rotating and fold mirrors are employed to serially couple the outputs from off axis located individual sources to provide a high brightness single source.

FIG. 12 illustrates an alternative embodiment of the present invention where it is designated generally as a system 140. In some respects, system 140 is similar to system 100 as illustrated in FIG. 10. However, it differs by the addition of a stationary mirror 148, preferably torroidal in form, and surrounding the optical axis of system 140. The use of stationary mirror 148 allows the overall system package to be smaller. In this arrangement, a collimated light beam 146 exits a light source assembly 142 or 144, each of which consist of some light source with lenses to collimate the light. This collimated ray bundle 146 reflects off of the stationary mirror 148, then off of a rotating mirror 150 and into an output optical fiber system 156. This output system 156 consists of lenses that refocus the light into the optical fiber for output. A rotational servo 152 connects to mirror 150 via a shaft 154 to selectively control the position of mirror 150 in concert with the timing and duty cycle of sources 142 and 144.

Figure 13:
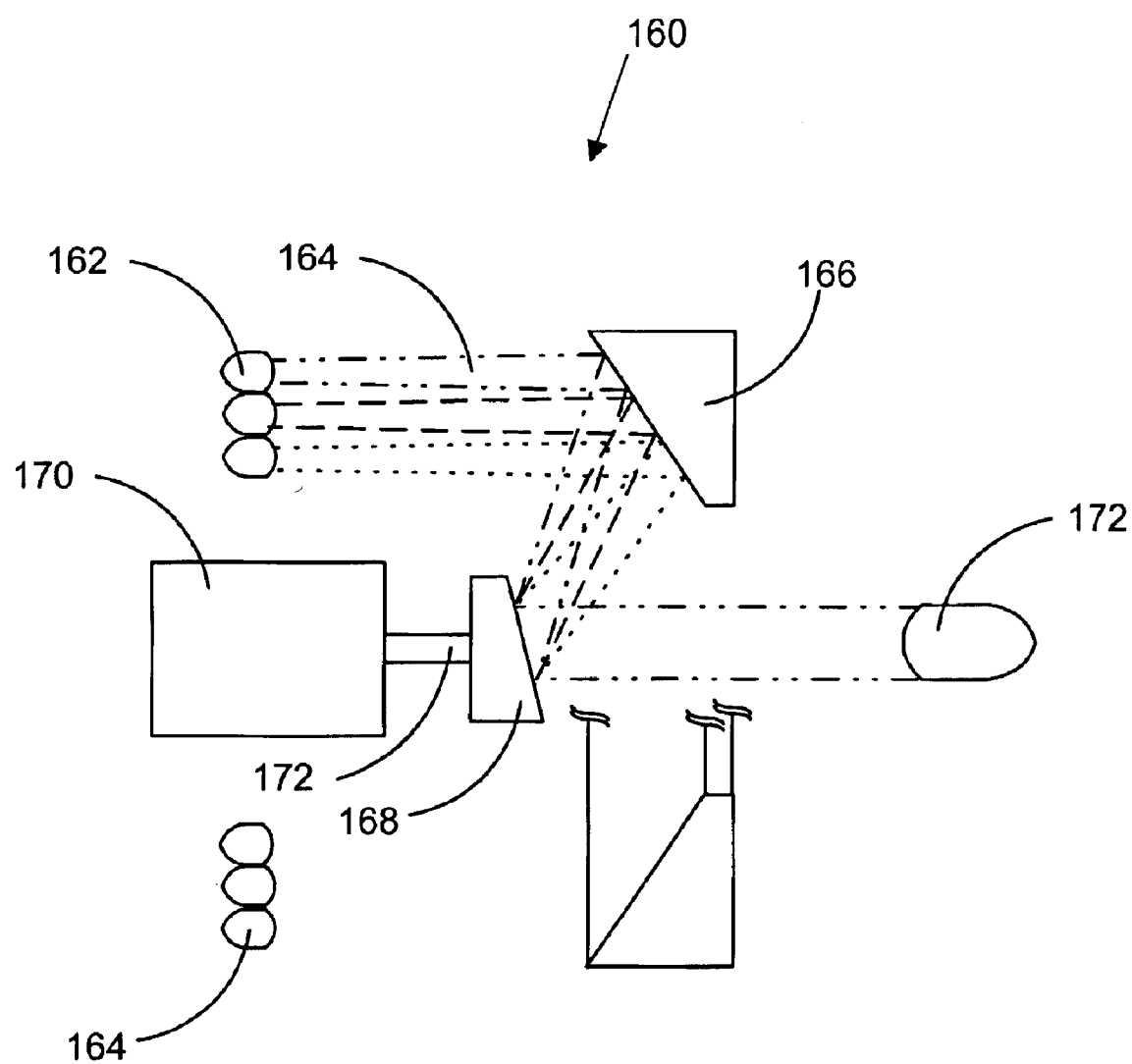
FIG. 13 is a diagrammatic elevational view illustrating another embodiment of the invention in which a rotating diffraction grating is used to serially couple the outputs from off axis located individual multiple wavelength sources to provide a high brightness single source.

While the invention so far has been discussed with light sources emitting over one wavelength or wave band, the present invention may also mix wave band or wavelengths to synthesize colors. FIG. 13 illustrates an alternative embodiment of the present of invention, designated generally as a system 160 that uses optically dispersive elements to couple multiple wavelengths of light into a single source.

System 160 illustrated in FIG. 13 is a variation of system 140 illustrated in FIG. 12, only each light source is replaced by a group of multiple light sources 162 and 164, and the rotating mirror is replaced by a rotating diffraction grating 168. These multiple groups of light sources are placed radially around the axis of rotation. Each light source 162 and 164 is of a different wavelength to provide a multiplicity of output beams 164, each of different spectral content or color. The light from each source 162 travels in a diverging ray bundle from the source, reflects off of a stationary mirror 166, substantially with 100 percent reflection, then reflects off of a diffraction grating 168. The diffraction grating 168 serves to collimate the light and reflect it toward an output optical fiber system 172, approximately matching the NA of the fiber in the process. The light is then focused down into an output fiber forming part of optical fiber system 172. In an alternative embodiment of the present invention, all of the light sources within each group are on simultaneously on. In yet another alternative embodiment of the present invention, all of the light sources within each group are pulsed, and/or separately turned on.

Figure 14:
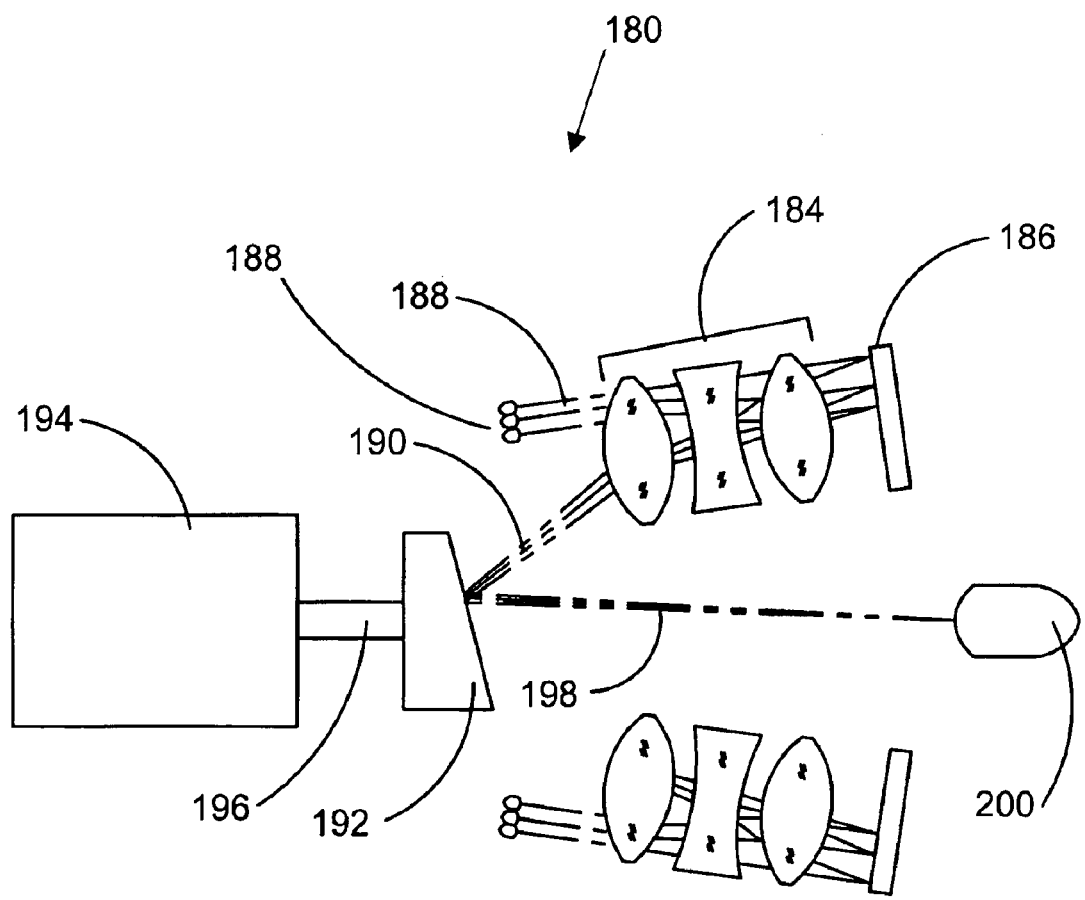
FIG. 14 is a diagrammatic elevational view of a multiple wavelength division multiplexer embodiment of the invention.

In yet another alternative embodiment of the present invention illustrated in FIG. 14, where it is designated generally as system 180, uses optically dispersive elements. The system 180 illustrated in FIG. 14 is similar to the system 160 illustrated in FIG. 13, only the diffraction grating is replaced by a wavelength division multiplexer or WDM. The WDM, which comprises a Cooke triplet 184 and grating 186, combines multiple, differing wavelength sources 188 into a single output ray bundle 198 that reflects off of a rotating mirror 192, with a common focus point. The output ray bundle 198 from the WDM is reflected off of a rotating mirror whose position is controlled by a servo 194 via shaft 196 and into fiber output 200.

In a variant of this alternative embodiment of the present invention, a multiple wavelength system is configured such that colors are combined to form any mixture of these chosen wavelengths. For example, the mixture could form a white light source.

Figure 15:
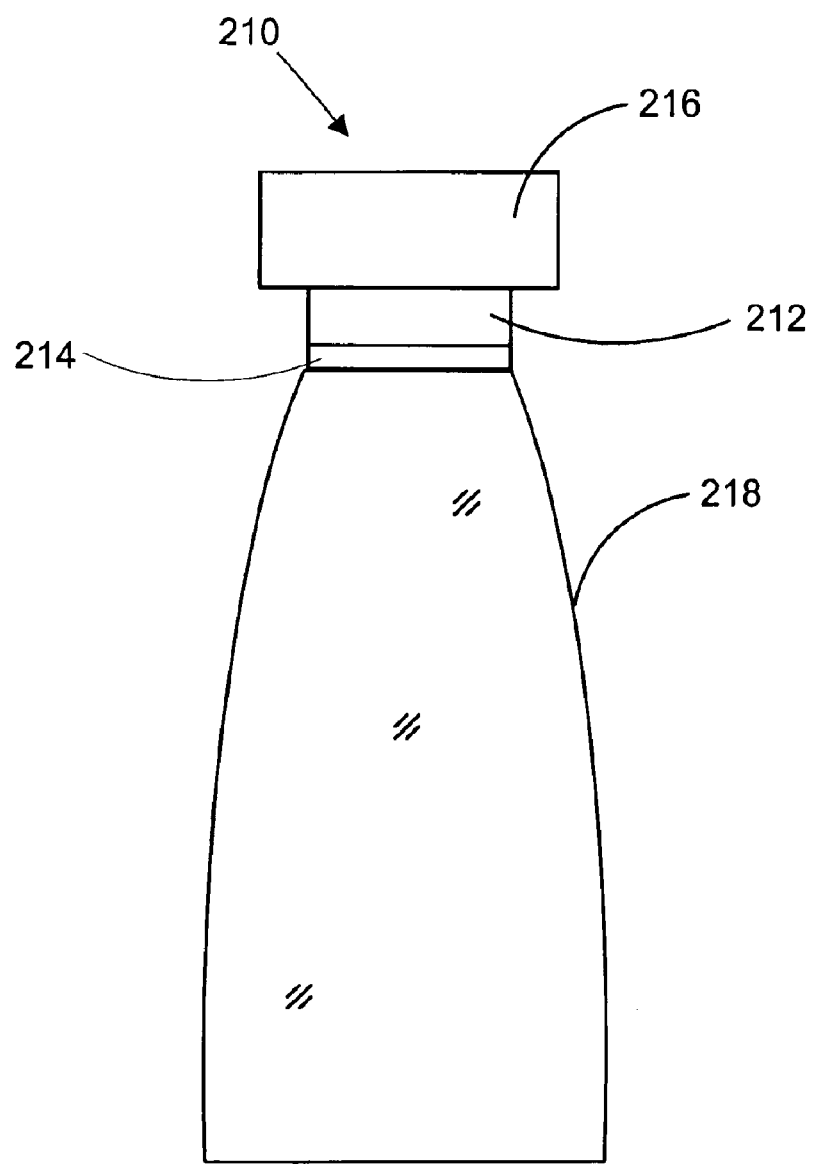
FIG. 15 is a diagrammatic elevational view of an LED with a phosphor layer to provide a color-converted source that may be used with the invention.

In an alternative embodiment of the present invention a single wavelength system 210 includes a phosphor-filled epoxy layer 214 placed over the face of an LED 212 to form a white light source, as illustrated in FIG. 15. Again, a heat sink-header 216 is provided for cooling purposes and a CPC 218 serves to collect and redirect the light emitted by the exit facet of the LED 212.

In an alternative embodiment, the light source 210 illustrated in FIG. 15 creates a scanning white light system.

Based on the teachings of the invention, other changes to the invention will occur to those skilled in the art and such changes are intended to be within the scope of the invention.

What is claimed is:

1. A high brightness illumination system, said system comprising:

a plurality of modulatable light sources spatially separated in a prearranged pattern;

drive means for exciting said light sources in a predetermined sequence to provide a plurality of light pulses that are separated in space and time; and scanning means for serially receiving and redirecting the outputs of said plurality of light pulses for travel in rapid succession along one or more collection paths to provide a collective output that is comparatively higher in brightness than would otherwise be possible with the light sources operating individually.

2. The system of claim 1 wherein each of said light sources illuminates over a predetermined solid angle, $\Omega_e$, from a predetermined emitting area, $A_e$, and said collection paths collect illumination over a predetermined solid collection angle, $\Omega_c$, and collection area, $A_c$ where the product $\Omega_e A_e$ is substantially equal to the product $\Omega_c A_c$.

3. The system of claim 1 wherein substantially all of the optical power emitted by each of said light sources is coupled into said collection path except for losses due to reflection and absorption.

4. The system of claim 1 wherein each of said light sources comprises a light emitting diode (LED).

5. The system of claim 4 further including a compound parabolic concentrator (CPC) for each of said plurality of sources for collecting radiation from a corresponding one of said plurality of sources and directing it in a given direction.

6. The system of claim 5 wherein each CPC is configured to operate by one of total internal reflection and reflective coatings.

7. The system of claim 4 wherein one or more of said LEDs emits radiation over predetermined spectral regions that is different from the spectral regions over the other LEDs emit radiation to control the color content of said collective output.

8. The system of claim 1 wherein one or more of said sources emits radiation over predetermined spectral regions that is different from the spectral regions over the other of said sources emit radiation to control the color content of said collective output.

9. The system of claim 1 wherein each of said light sources comprises a laser diode.

10. The system of claim 1 wherein said plurality of light sources is selected from the group consisting laser emitting diodes, xenon flash lamps, and laser diodes.

11. The system of claim 1 wherein said plurality of light sources comprises an array of sources each of which is arranged to emit radiation in a given direction and an array of compound parabolic concentrators (CPC), said array of sources and said array of CPCs being arranged with respect to one another so that each source emits radiation into a corresponding one of said CPCs and the outputs of said CPCs all are pointed in given directions.

12. The system of claim 11 wherein each individual CPC of said array of CPCs is configured to operate by one of total internal reflection and reflective coatings.

13. The system of claim 12 wherein said array of CPCs is fabricated as a single injection molded piece.

14. The system of claim 11 further including collimating optics for receiving said outputs from said CPCs and collimating them for downstream travel as a plurality of collimated beams.

15. The system of claim 14 wherein said scanning means comprises a focusing lens, one of a re-imaging lens and compound parabolic concentrator, and a scanning subsystem located intermediate said focusing lens and said re-imaging lens; said focusing lens, said drive means, said scanning subsystem, and said re-imaging lens being configured and arranged with respect to one another so that, when an individual one of said sources is sequenced on by said drive means, said focusing lens images its corresponding collimated beam onto said scanning subsystem, and said re-imaging lens, in turn, re-images it onto the entrance of said collection path.

16. The system of claim 15 wherein said scanning subsystem comprises a scanning mirror having at least one tilt axis.

17. The system of claim 15 wherein each of said light sources illuminates over a predetermined solid angle, $\Omega_e$, from a predetermined emitting area, $A_e$, and said collection paths collect illumination over a predetermined solid collection angle, $\Omega_c$, and collection area, $A_c$ where the product $\Omega_e A_e$ is substantially equal to the product $\Omega_c A_c$.

18. The system of claim 15 wherein substantially all of the optical power emitted by each of said light sources is coupled into said collection path except for losses due to reflection and absorption.

19. The system of claim 1 wherein said system has a folded optical path that comprises an initial leg and a final leg arranged at a predetermined angle with respect to said initial leg and wherein said light sources are arranged to emit radiation in a direction generally parallel to said initial leg and collect radiation along said final leg.

20. The system of claim 1 wherein said system has an optical axis wherein said light sources are arranged radially around said optical axis to emit radiation along paths in directions generally at an angle with respect to said optical axis, wherein said collection path is arranged along said optical axis, and wherein said scanning means is positioned along said optical axis to serially collect radiation from each of said light sources and direct it generally along said optical axis to said collection path.

21. The system of claim 20 wherein said light sources are arranged around said optical axis to emit radiation generally perpendicular to said optical axis and said scanning means a rotating prism.

22. The system of claim 20 wherein said scanning means comprises an optical component selected from the group consisting of a mirror, prism, diffraction grating, acousto-optic modulator, wavelength division multiplexer, dichroic element, Fresnel mirror, and Pellicle mirror.

23. The system of claim 22 wherein said scanning means comprises an acuator selected from the group consisting of a stepper motor, DC servo motor, Voice coil, galvanometer, and micro-electromechanical device (MEMS).

24. The system of claim 1 wherein the brightness of said collective output is at least a factor of two brighter than the brightness of said individual sources operating continuously.

25. The system of claim 1 wherein the brightness of said collective output is at least an order of magnitude brighter than the brightness of said individual sources operating continuously.

26. The system of claim 1 wherein the brightness of said collective output is approximately a factor of twenty brighter than the brightness of said individual sources operating continuously.

27. The system of claim 24 wherein said plurality of sources comprise LEDs operating at duty cycles of less than 80%.

28. The system of claim 1 wherein said system has a folded optical path that comprises an initial leg and a final leg that is offset with respect to said initial leg and parallel thereto and wherein said light sources are arranged to emit radiation in a direction generally parallel to said initial leg and collect radiation along said final leg.

29. The system of claim 28 wherein said scanning means includes a torroidal mirror fixedly arranged around said final leg and a rotating prismatic element arranged along and on said final leg, said torroidal mirror and said rotating prismatic element being configured and arranged with respect to one another such that said rotating prismatic element scans each of said plurality of light sources in turn as they are sequenced on by said drive means to direct their respective outputs along said collection path.

30. The system of claim 29 wherein each of said plurality of light sources itself comprises an subsystem array of sources and further including a triplet lens to converge the outputs from each subsystem array of sources onto said rotating array after which it further converges towards said final leg along which it is substantially focused.

31. A high brightness illumination system, said system comprising:

a plurality of modulatable light sources spatially separated in a prearranged pattern wherein said plurality of light sources comprises an array of sources each of which is arranged to emit radiation in a given direction and an array of compound parabolic concentrators (CPC), said array of sources and said array of CPCs being arranged with respect to one another so that each source emits radiation into a corresponding one of said CPCs and the outputs of said CPCs all are pointed in given directions;

collimating optics for receiving said outputs from said CPCs and collimating them for downstream travel as a plurality of collimated beams;

drive means for exciting said light sources in a predetermined sequence to provide a plurality of light pulses that are separated in space and time; and scanning means for serially receiving and redirecting the outputs of said plurality of light pulses for travel in rapid succession along one or more collection paths to provide a collective output that is comparatively higher in brightness than would otherwise be possible with the light sources operating individually, said scanning means comprising a focusing lens, a re-imaging lens, and a scanning subsystem located intermediate said focusing lens and said re-imaging lens. said focusing lens, said drive means, said scanning subsystem, and said re-imaging lens being configured and arranged with respect to one another so that, when an individual one of said sources is sequenced on by said drive means, said focusing lens images its corresponding collimated beam onto said scanning subsystem, and said re-imaging lens, in turn, re-images it onto the entrance of said collection path.

32. The system of claim 31 wherein said scanning subsystem comprises a two-axis scanning mirror.

33. A method for providing high brightness source of illumination, said method comprising the steps of:

mounting a plurality of modulatable light sources so that they are spatially separated in a prearranged pattern;

exciting said light sources in a predetermined sequence to provide a plurality of light pulses that are separated in space and time and higher in intensity than would otherwise be produced by said sources operating continuously; and scanning said outputs of said light sources to serially receive and redirect said outputs for travel in rapid succession along one or more collection paths to provide a collective output that is comparatively higher in brightness than would otherwise be possible with the light sources operating individually.

34. The method of claim 33 wherein each of said light sources illuminates over a predetermined solid angle, $\Omega_e$, from a predetermined emitting area, $A_e$, and said collection paths collect illumination over a predetermined solid collection angle, $\Omega_c$, and collection area, $A_c$ where the product $\Omega_e A_e$ is substantially equal to the product $\Omega_c A_c$.

35. The method of claim 33 wherein substantially all of the optical power emitted by each of said light sources is coupled into said collection path except for losses due to reflection and absorption.

36. The method of claim 33 wherein each of said light sources comprises a light emitting diode (LED).

37. The method of claim 36 further including a compound parabolic concentrator (CPC) for each of said plurality of sources for collecting radiation from a corresponding one of said plurality of sources and directing it in a given direction.

38. The method of claim 36 wherein each CPC is configured to operate by one of total internal reflection and reflective coatings.

39. The method of claim 36 wherein one or more of said LEDs emits radiation over predetermined spectral regions that is different from the spectral regions over the other LEDs emit radiation to control the color content of said collective output.

40. The method of claim 33 wherein one or more of said sources emits radiation over predetermined spectral regions that is different from the spectral regions over the other of said sources emit radiation to control the color content of said collective output.

41. The method of claim 33 wherein each of said light sources comprises a laser diode.

42. The method of claim 33 wherein said plurality of light sources is selected from the group consisting laser emitting diodes, xenon flash lamps, and laser diodes.

43. The method of claim 33 wherein the brightness of said collective output is at least a factor of two brighter than the brightness of said individual sources operating continuously.

44. The method of claim 33 wherein the brightness of said collective output is at least an order of magnitude brighter than the brightness of said individual sources operating continuously.

45. The method of claim 33 wherein the brightness of said collective output is approximately a factor of twenty brighter than the brightness of said individual sources operating continuously.

46. The method of claim 33 wherein said plurality of sources comprise LEDs operating at duty cycles of less than 80%.

* * * * *